United States Patent
Niu et al.

[11] Patent Number: 5,814,290
[45] Date of Patent: Sep. 29, 1998

[54] SILICON NITRIDE NANOWHISKERS AND METHOD OF MAKING SAME

[75] Inventors: Chun-Ming Niu, Somerville; David Moy, Winchester, both of Mass.

[73] Assignee: Hyperion Catalysis International, Cambridge, Mass.

[21] Appl. No.: 506,250

[22] Filed: Jul. 24, 1995

[51] Int. Cl.⁶ .................................................. C01B 21/068
[52] U.S. Cl. .................................................. 423/344
[58] Field of Search ................................................ 423/344

[56] References Cited

U.S. PATENT DOCUMENTS

| | | | |
|---|---|---|---|
| 3,394,991 | 7/1968 | Evans | 423/344 |
| 3,413,090 | 11/1968 | Krock et al. | 423/344 |
| 4,521,393 | 6/1985 | Saito et al. | 423/344 |
| 4,530,825 | 7/1985 | Johansson | 423/344 |
| 4,663,230 | 5/1987 | Tennent | 428/367 |
| 5,171,560 | 12/1992 | Tennent | 423/447.3 |

FOREIGN PATENT DOCUMENTS

| | | | |
|---|---|---|---|
| 65000 | 3/1988 | Japan | 423/344 |
| 278405 | 11/1989 | Japan | 423/344 |
| 278406 | 11/1989 | Japan | 423/344 |
| 2178417 | 2/1987 | United Kingdom | 423/344 |

*Primary Examiner*—Wayne Langel
*Attorney, Agent, or Firm*—Whitman Breed Abbott & Morgan, LLP

[57] ABSTRACT

Silicon nitride nanowhiskers predominantly having diameters substantially less than about 200 nm are disclosed. The nanowhiskers of $Si_3N_4$ are produced by reacting gaseous SiO and $N_2$ at elevated temperature and pressure in a reaction zone in the presence of a plurality of disperse carbon nanotubes having a diameter of from 3.5 to 70 nm.

5 Claims, 4 Drawing Sheets

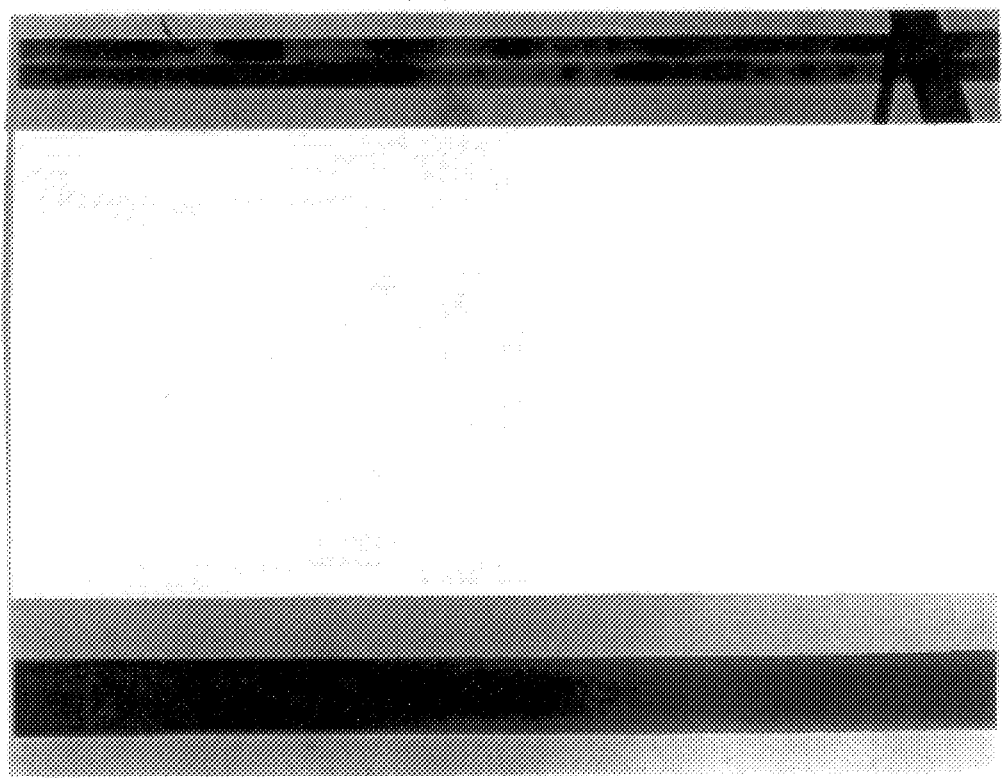

SILICON NITRIDE NANOWHISKERS AND METHOD OF MAKING SAME

FIELD OF THE INVENTION

The invention relates to silicon nitride nanowhiskers and a method of making them.

BACKGROUND OF THE INVENTION

Ceramics are materials of the future. However, they are notoriously brittle and many potential applications of ceramics as high temperature structural materials have been hindered by their lack of toughness and reliability.

In order to improve the toughness and reliability of ceramics, some efforts have been directed towards the development of nanophase ceramics and nanophase ceramic composites. Drastically different properties can be obtained by making ceramic composites and by making ceramic materials into nanograin structured materials. For examples, the toughness and strength of nanophase $Al_2O_3$—SiC composites are two to five times greater than those of the same materials with conventional structures, and a $Si_3N_4$—SiC nanophase composite can be stretched to two and a half times its original length at 1600° C.

Nanostructured materials have attracted considerable experimental and theoretical interest. New materials, such as high temperature ceramics exhibiting superplasticity or porous silicon with novel optical properties have been developed. SiC and $Si_3N_4$ nanowhiskers are interesting for various potential applications, including the development of supertough, superstrong ceramic and metal matrix nanocomposites.

Because of the nature of covalent bonds, $Si_3N_4$ has many desirable engineering proprieties, including high hardness, high strength and modulus, good thermal shock resistance and excellent chemical stability. $Si_3N_4$ in whisker form is considered one of the ideal materials for the development of advanced composites.

Various processes have been reported for the preparation of $Si_3N_4$ whiskers. In 1966, R. C. Johnson (1) and his coworkers prepared $Si_3N_4$ whiskers by carbothermal reduction-nitridation (CTR/N) of $SiO_2$ starting from a mixture of $SiO_2$ and carbon. Several groups (2–6) also reported studies on this process. The whiskers produced by this process are single crystal and have diameter distribution from submicrons (0.5) to several microns. A catalytic process has also been used to produce $Si_3N_4$ whiskers. The process uses a transition metal (typically, Fe) as catalyst, $NH_3$ (or $N_2$) as nitrogen source and SiO (or $SiH_4$) as silicon source. The mechanism is identical to that for VLS growth of SiC whiskers. A 1983 report (7) by J. V. Milewski and his coworkers showed that $Si_3N_4$ whiskers 0.5–8 micrometers in diameter and 1–10 millimeters in length can be prepared by a catalytic process. Recent reports (8–9) by K. J. Huttinger and T. W. Pieschnick showed similar results. Y. Mizuhara (10–11) and his coworkers prepared $Si_3N_4$ whiskers by nitridation of diatomaceous earth on a carbon plate. Because of the presence in the diatomaceous earth, the reaction showed PATENT characteristics of both CTR/N and VLS. The diameters of the whiskers produced were from 0.1–10 micrometers. T. Isolda (12) and his coworkers reported the formation of transparent $Si_3N_4$ fibers from polymethylsilazane precursor. The major problem with this approach is that the $Si_3N_4$ fibers prepared were amorphous.

OBJECTS OF THE PRESENT INVENTION

It is an object of the invention to provide a plurality of silicon nitride nanowhiskers predominantly having diameters of less than about 200 nm.

It is a further object of the invention to provide such nanowhiskers which are of high quality and generally uniform diameter.

It is a further object of the present invention to provide silicon nitride nanowhiskers which are substantially unfused to one another.

It is an object of the present invention to provide a method of making a plurality of silicon nitride nanowhiskers predominantly having diameters substantially less than about 200 nm, in situ, from carbon nanotubes or nanofibrils.

SUMMARY OF THE INVENTION $Si_3N_4$ nanowhiskers can be prepared using carbon nanotubes. The nanowhiskers, crystallized with $\alpha$-$Si_3N_4$ structure, were prepared by a carbothermal reduction and nitridation process. These nanowhiskers are characterized by diameters of 30–200 nm, a length of greater than several millimeters and straight needle-like morphology. The individual needles are almost perfect single crystals.

BRIEF DESCRIPTION OF THE DRAWINGS

FIG. 3 is a transmission electron photomicrograph (TEM) of $Si_3N_4$ nanowhiskers of the invention.

DETAILED DESCRIPTION OF THE INVENTION

Figure 1:
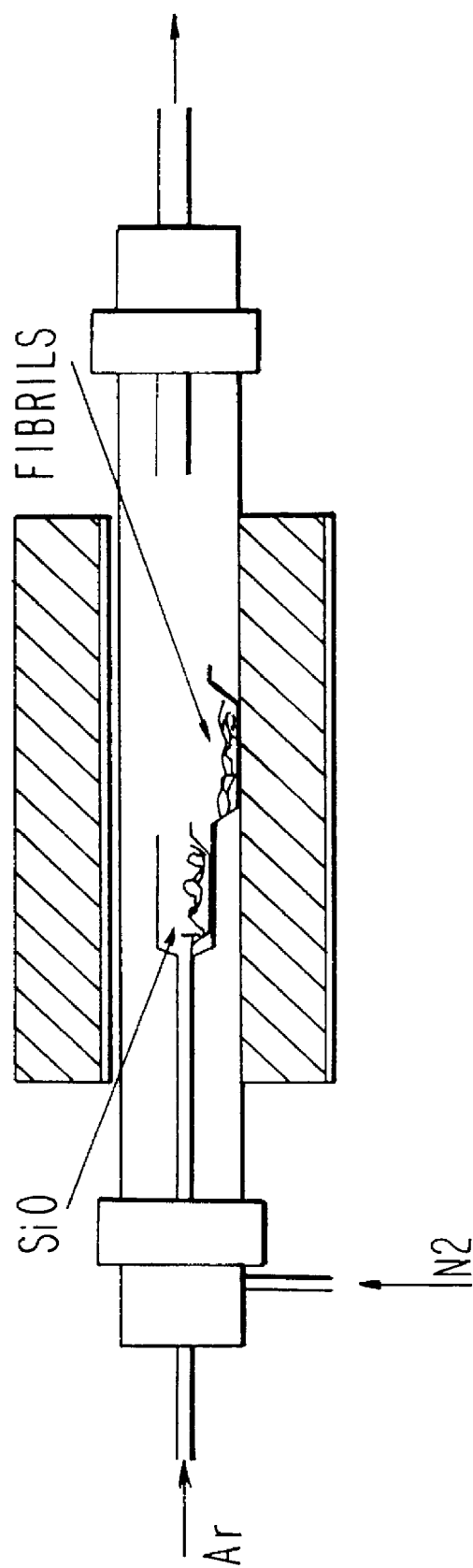
FIG. 1 is a schematic depiction of a reaction furnace for making silicon nitride nanowhiskers in accordance with the invention.

The invention is broadly in a method for the production of nanowhiskers of $Si_3N_4$ by reacting gaseous SiO and nitrogen at elevated temperature and pressure in a reaction zone in the presence of a plurality of dispersed carbon nanofibrils having a diameter of broadly from 3.5 to 70 nm and preferably from 7 to 12 nm.

The carbon nanotubes used in the synthesis are BN ("bird's nest") and cc ("cotton candy") fibrils, produced by Hyperion Catalysis International, Inc., Cambridge, Mass. These carbon fibrils are produced by catalytic decomposition of carbon-based gas, such as hydrocarbon gas, and are characterized by substantially uniform diameters between about 7–12 nm, multiple graphitic carbon layers arranged concentrically around the tube axis, a hollow core and aspect ratios of about 10–500.

The foregoing nanotubes or nanofibrils are grown in aggregates having a macroscopic morphology of either bundles of relatively straight tubules, cotton candy ("CC"), or approximately spherical aggregates of highly intertwining, curved tubules resembling bird nests ("BN"), or combinations of these. The individual tubules in any aggregate have a relatively narrow diameter distribution, the great majority being in the range of 7–9 nm for bundles, 8–12 nm for BN. In either aggregate morphology, essentially all the carbon is in the form of nanotubes. The inter-tubule distances in the aggregates are large, up to 100 nm (aggregates contain up to 95% void volumes). These fibrils are generally free of a thermal carbon overcoat. Such fibrils and the manner of making them are described, for example, in U.S. patent application Ser. No. 08/352,400, filed Dec. 8, 1994, U.S. patent application Ser. No. 149,573, filed Jan. 28, 1988, U.S. Pat. No. 4,663,230, and U.S. Pat. No. 5,171,560, all of which are owned by the same assignee as the present invention. The contents of these applications and patents are incorporated herein by reference.

Although these starting carbon fibrils are preferred, other carbon nanotubes, such as carbon arc grown nanotubes and other carbon nanofibrils having diameters in the same general range, and up to about 50 nm, may also be employed, although with generally less satisfactory results.

Silicon monoxide may advantageously be used as the silicon source. Other silicon source gases and combinations of gases may also be used besides the SiO source employed in the examples above. For example, a mixture of $SiO_2$ and Si at a temperature of 1000 C. to about 1400 C. may also be used. As another example, Si and $H_2$ at about 1200° C. may be used. Other exemplary source gases include the following: $SiH_xCl_{(4-x)}$, where x=integer; $SiR_xY_{(4-x)}$, where x=integer, and R=alkyl, aryl, etc., Y=H or Cl; $Si(ZR)_xA_{(4-x)}$, where x=integer, A=R or Cl, R=alkyl, aryl, etc., and Z=O, N. Of course, these are only examples of silicon source gases and there is no intention of limiting the invention to these examples alone. The nitrogen source can be $N_2$, $NH_3$, hydrazine, hydroxylamine, or other compound known in the art to be a source of nitrogen.

The temperature of the reaction may broadly be from 1000° C. to 1500° C. and preferably is from 1200° C. to 1400° C.

EXAMPLE I

The carbon nanotubes used in this reaction were Hyperion BN or CC fibrils. Silicon monoxide (Johnson Matthey) was used as a silicon source. As shown in FIG. 1, the reaction apparatus consists of a tubular resistance furnace, a quartz tube with a inner tube and end caps.

About 200 mg SiO was placed in an alumina boat which was positioned in the inner quartz tube. About 50 mg carbon nanotubes were spread in another alumina boat that was positioned in the main tube next to the inner tube outlet. The inner tube was purged with Ar at a flow rate of approximately 20 cc/min. The main tube was under $N_2$ atmosphere with a flow rate of 60 cc/min. The reaction was carried out at 1200° C. for 20 hr.

A white rubbery material which was identified by x-ray diffraction to be silicon nitride, was formed on the top of the carbon nanotubes which had been partially converted to SiC nanofibrils. After physically separating it from the rest of the material, the white product was studied with electron microscopy.

Figure 2A:
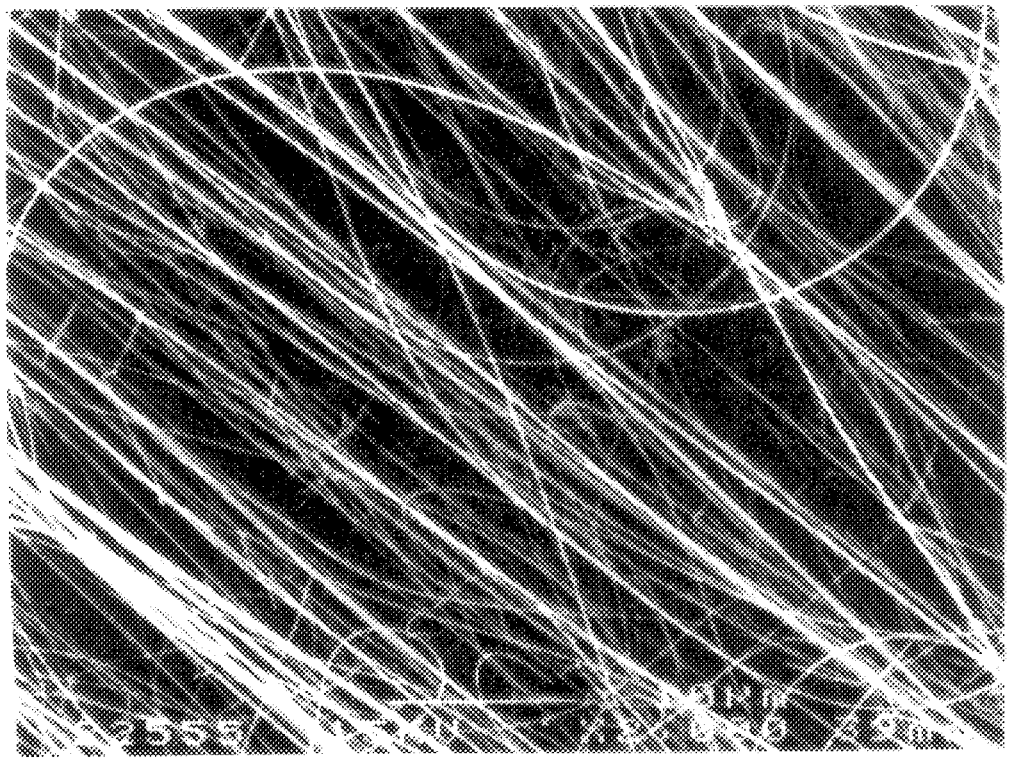
FIG. 2 is a scanning electron photomicrograph (SEM) of $Si_3N_4$ nanowhiskers.
Figure 2B:
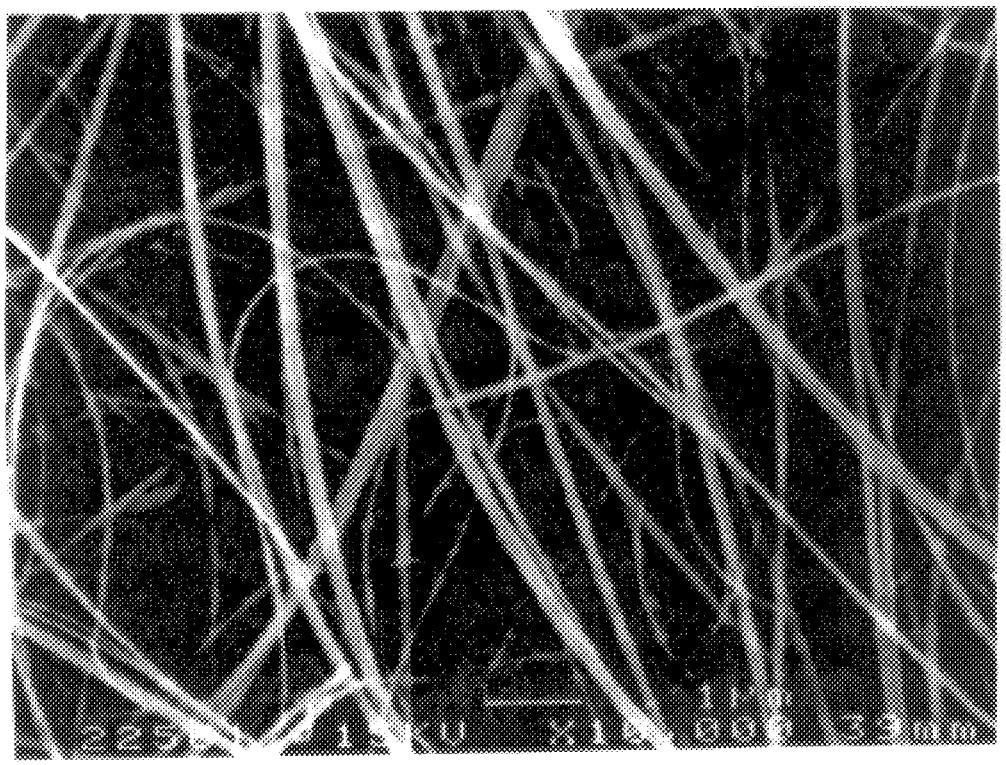

FIG. 2 shows SEM micrographs of as-prepared product. It can be seen from FIG. 2 that the products are nanowhiskers. They are straight, with diameters between 30–200 nm. By way of definition, where the nanowhiskers have a polyhedral cross section, the effective diameter is defined as the perimeter of the cross section divided by $\pi$. Within a single whisker, the diameter is a constant. FIG. 3 is a TEM micrograph of a single nanowhisker with a diameter of 65 nm. The surface of the fibrils is very smooth.

Figure 4:
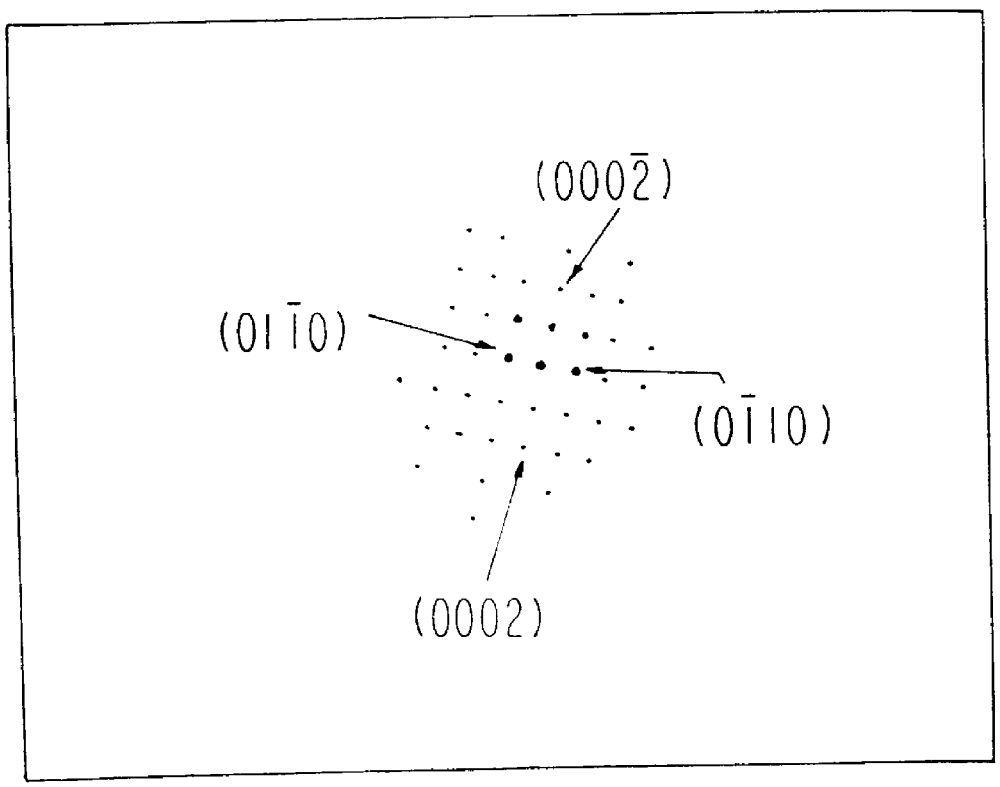
FIG. 4 is an electron diffraction pattern of a single $Si_3N_4$ whisker. The zone axis is [2110].

The TEM study showed that some of the nanowhiskers crystallized as rectangular beams with perfect crystallographic facets (see FIG. 3A). The select area electron diffraction (FIG. 4) was performed on a single nanowhisker, revealing that the nanowhisker is a nearly perfect single crystal. The crystallographic structure of the product was characterized by X-ray diffraction (XRD). The diffraction pattern can be indexed as $\alpha$-$Si_3N_4$ with cell parameters of $\alpha$=0.775 nm and b=0.562 nm. The surface composition of the nanowhiskers was characterized with X-ray ray photo-electron spectroscopy (XPS). In addition to the signals of Si2s,2p and N1s, the signals of C1s and O1s were also registered in the XPS spectrum. Assuming the signal of O1s was from the surface absorbed SiO, the ratio of Si to N was very close to ¾. The weak signal of C1s can be attributed to organic carbon.

The chemical reaction that takes place can be postulated as follows:

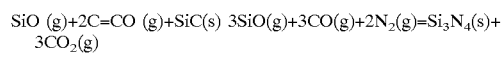

$$SiO\ (g)+2C=CO\ (g)+SiC(s)\ 3SiO(g)+3CO(g)+2N_2(g)=Si_3N_4(s)+3CO_2(g)$$

The reaction of carbon nanotubes with SiO produces CO and nanofibrils of SiC (a process is described in copending U.S. application Ser. No. 08/414,369 filed Mar. 31, 1995 whereby incorporated by reference) which have similar dimensions and spatial relationships to the starting carbon nanofibrils. This results in a network of SiC nanofibrils ranging from 5–50 nm in diameter, in which the individual strands are separated by relatively large distances, ca. 10–100 nm.

The SiC nanofibrils provide nucleation sites for $Si_3N_4$ and continuous vapor deposition of Si and N results in the growth of silicon nitride nanowhiskers with the dimensions observed (2–300 nm). The low temperature of the reaction (1200°–1400° C.) and the relatively large distances between SiC nanofibrils prevents the nucleated sites from agglomerating or growing by diffusion of smaller crystallites. Thus the whiskers maintain their very small dimensions. These small dimensions have not been achieved by previously reported processes.

EXAMPLE II

Comparative experiments using high surface area acetylene black (Chevron) or graphite powder (Lonza KS-15) as the starting carbon were carried out under identical conditions. However, only particles of $Si_3N_4$ were observed. There were no whiskers as were seen in Ex. 1.

From carbon nanotubes, essentially only silicon nitride nanowhiskers with diameters ranging from 30 to 200 nm were obtained. Substantially all of the carbon from the starting nanotubes was converted to CO or SiC. The silicon nitride nanowhiskers appeared to remain separated and predominantly unfused to each other. The structural modification appeared to be alpha-$Si_3N_4$, as determined by XRD. The diameters of the resulting $Si_3N_4$ nanowhiskers were about 3–20 times that of the starting carbon nanofibrils.

The generally uniform and very small size $Si_3N_4$ nanowhiskers in accordance with the present invention are useful for forming extremely fine abrasives, nanophase ceramics, nanophase ceramic composites, and as reinforcement in metal matrix nanocomposites using a high temperature, high strength metallic base material, particularly for high temperature, high strength applications such as gas turbine blades.

BIBLIOGRAPHY

1. R. C. Johnson, J. K. Alley, W. H. Warwick, H. Wilbur and H. R. Shell, U.S. Pat. No. 3,244,480, Apr. 5, 1966.
2. S. B. Hanna, A. L. N. Mansour and A. S. Taha, Trans. J. Brit. Ceram. Soc., 84, 18 (1985).
3. Y. Kaneko, K. Ameyama and H. Iwasaki, J. Soc., Mater. Sic. Jpn., 37, 65 (1988).
4. M. J. Wang and H. Wada, J. Mater. Sci., 25, 1690 (1990).
5. M. Mizuhara, M. Noguchi, T. Ishihara, A. Satoh, K. Hiramatsu and Y. Takita, J. Am. Ceram. Soc., 74, 846 (1991).

6. D. Ramesh and K. J. Rao, J. Mater. Res., 9, 2330 (1994).
7. J. V. Milewski, F. D. Gac and J. J. Petrovic, LA-9650-MS, Feb., 1983.
8. K. J. Huttinger and T. W. Pieschnick, Adv. Mater., 6(1), 62 (1994).
9. K. J. Huttinger and T. W. Pieschnick, J. Mater. Sic., 29, 2879 (1994).
10. Y. Mizuhara, M. Noguchi, T. Ishihara, Y. Takita, T. Shiomisu and H. Arai, J. Am. Ceram. Soc., 74, 846 (1991).
11. Y. Mizuhara, M. Noguchi, T. Ishihara and Y. Takita, J. Am. Ceram. Soc., 78, 109 (1995).
12. T. Isoda and M. Arai, JPN. Patent 60-145903, 1985.

We claim:

1. A method for the production of nanowhiskers of primarily alpha-$Si_3N_4$ comprising the step of reacting components consisting essentially of gaseous SiO, a source of nitrogen at elevated temperature and pressure and a plurality of carbon nanotubes having a diameter of from 3.5 to 70 nm in a reaction zone.

2. A method as recited in claim 1 where the gaseous SiO is formed in said reaction zone from solid SiO.

3. A method as recited in claim 1 wherein the temperature of the reaction is from 1200° to 1400° C.

4. A method as recited in claim 1 wherein the source of nitrogen is $N_2$, $NH_3$, ammonia or hydrazine.

5. A method as recited in claim 4 wherein the source of nitrogen is $N_2$.

* * * * *